United States Patent
Lo et al.

(10) Patent No.: US 11,201,621 B2
(45) Date of Patent: Dec. 14, 2021

(54) CLOCK GATING CELL

(71) Applicant: REALTEK SEMICONDUCTOR CORP., Hsinchu (TW)

(72) Inventors: Yu-Cheng Lo, Taichung (TW); Yu-Jen Pan, Kaohsiung (TW); Wei-Chih Shen, Hsinchu (TW); Chien-Wei Shih, Hsinchu County (TW); Jiunn-Way Miaw, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/205,559

(22) Filed: Mar. 18, 2021

(65) Prior Publication Data

US 2021/0313986 A1 Oct. 7, 2021

(30) Foreign Application Priority Data

Apr. 1, 2020 (TW) .................................. 109111232

(51) Int. Cl.
*H03K 19/00* (2006.01)
*G01R 31/3185* (2006.01)
*H03K 19/0185* (2006.01)

(52) U.S. Cl.
CPC . *H03K 19/0016* (2013.01); *G01R 31/318552* (2013.01); *H03K 19/01855* (2013.01)

(58) Field of Classification Search
None
See application file for complete search history.

(56) References Cited

U.S. PATENT DOCUMENTS

| | | | | |
|---|---|---|---|---|
| 5,907,562 | A * | 5/1999 | Wrape ............ | G01R 31/318555 714/726 |
| 8,788,895 | B2 * | 7/2014 | Feldman ........ | G01R 31/318594 714/726 |
| 2005/0034038 | A1 * | 2/2005 | Paglieri .......... | G01R 31/318552 714/726 |
| 2007/0075738 | A1 | 4/2007 | Hamada et al. | |
| 2008/0282122 | A1 * | 11/2008 | Guettaf .......... | G01R 31/318594 714/731 |
| 2010/0033229 | A1 * | 2/2010 | Irie ...................... | H03K 19/007 327/365 |
| 2014/0040688 | A1 * | 2/2014 | Zhang ............ | G01R 31/318541 714/727 |
| 2018/0059178 | A1 * | 3/2018 | Wang ............... | G01R 31/31725 |

* cited by examiner

*Primary Examiner* — Amy Cohen Johnson
*Assistant Examiner* — James H Cho
(74) *Attorney, Agent, or Firm* — Li & Cai Intellectual Property (USA) Office

(57) ABSTRACT

A clock gating cell (CGC) is provided. The clock gating cell includes two latches that can be configured as a flip-flop to use positive/negative edges of a first clock signal to store a value of an input terminal, and the clock gating cell also includes a selector used for the flip-flop to select from values of different input terminals for storing. In addition, in a non-scan testing mode, the clock gating cell can forcefully close an unused latch through an independent signal, and in a scan shift duration and a scan capture duration of a scan testing mode, the clock gating cell can further forcefully output the first clock signal as the gating clock signal according to two independent signals.

7 Claims, 6 Drawing Sheets

CLOCK GATING CELL

CROSS-REFERENCE TO RELATED PATENT APPLICATION

This application claims the benefit of priority to Taiwan Patent Application No. 109111232, filed on Apr. 1, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a clock gating cell (CGC), and more particularly to a clock gating cell suitable for a scan chain.

BACKGROUND OF THE DISCLOSURE

A scan chain is a design for testing an implementation technology, which is applied in a scan testing mode to detect various faults in a combinational logic circuit. Generally, the scan chain is composed of the combinational logic circuit and at least one flip-flop connected in series, and a clock signal input to the flip-flop can be provided by a clock gating cell. For example, reference is made to FIG. 1 and FIG. 2. FIG. 1 is a schematic circuit diagram of a conventional clock gating cell. FIG. 2 is a schematic diagram showing the clock gating cell of FIG. 1 being used in the scan chain. As shown in FIG. 1, a clock gating cell 10 includes an OR gate 101, a latch 102, and an AND gate 103. The OR gate 101 has a first input terminal and a second input terminal respectively receiving a test enable signal TEST_SE and a clock enable signal EN, and an output terminal coupled to a data input terminal LD of the latch 102.

A clock input terminal LG of the latch 102 receives a second clock signal CLKB (not shown) that is an inversion of the first clock signal CLK, and a data output terminal LQ of the latch 102 is coupled to a first input terminal of the AND gate 103. A second input terminal of the AND gate 103 receives the first clock signal CLK, and an output terminal is configured to output a gating clock signal GCLK as the clock signal input to the flip-flop 12. That is, as shown in FIG. 2, a clock input terminal CK of the flip-flop 12 is coupled to the output terminal of the AND gate 103, or the output terminal of the AND gate 103 can be referred to as an output terminal of the clock gating cell 10. In addition, a data input terminal D of the flip-flop 12 is coupled to the combinational logic circuit 14. However, in the scan testing mode, not only should a scan pattern meet the test conditions to input the data input terminal D of the flip-flop 12, but the scan chain 1 must also simultaneously meet enabling conditions of the clock gating cell 10, otherwise, the scan test will not be able to be performed. Therefore, designing a clock gating cell that is more suitable for the scan chain 1 has become an important issue in the art.

SUMMARY OF THE DISCLOSURE

In response to the above-referenced technical inadequacies, the present disclosure provides a clock gating cell including a selector, a first latch, an OR gate, and a first AND gate. The selector has a first input terminal and a second input terminal respectively receiving a clock enable signal and a scan input signal, a selector terminal receiving a test enable signal, and an output terminal configured to output the clock enable signal or the scan input signal. The first latch has a clock input terminal receiving a second clock signal being an inversion of a first clock signal, a data input terminal coupled to the output terminal of the selector, and a data output terminal configured to output a latch signal. The OR gate has a first input terminal, a second input terminal and a third input terminal respectively receiving a test bypass signal, the test enable signal and the latch signal, and an output terminal configured to output operational results generated by performing logic OR operations respectively on the test bypass signal, the test enable signal and the latch signal. The first AND gate has a first input terminal coupled to the output terminal of the OR gate, a second input terminal receiving the first clock signal, and the output terminal configured to output a gating clock signal.

Preferably, the clock gating cell further includes a second AND gate and a second latch. The second AND gate has a first input terminal and a second input terminal respectively receiving the first clock signal and a test mode signal, and an output terminal configured to output operational results generated by performing logic AND operations respectively on the first clock signal and the test mode signal. The second latch has a clock input coupled to the output terminal of the second AND gate, the data input terminal coupled to the data output terminal of the first latch, and the data output terminal configured to output a scan output signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
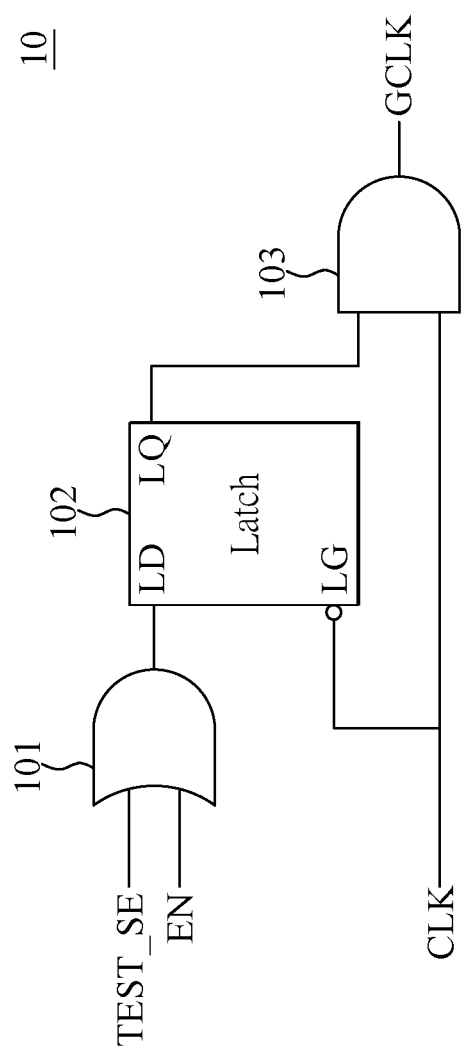
FIG. 1 is a schematic circuit diagram of a conventional clock gating cell.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
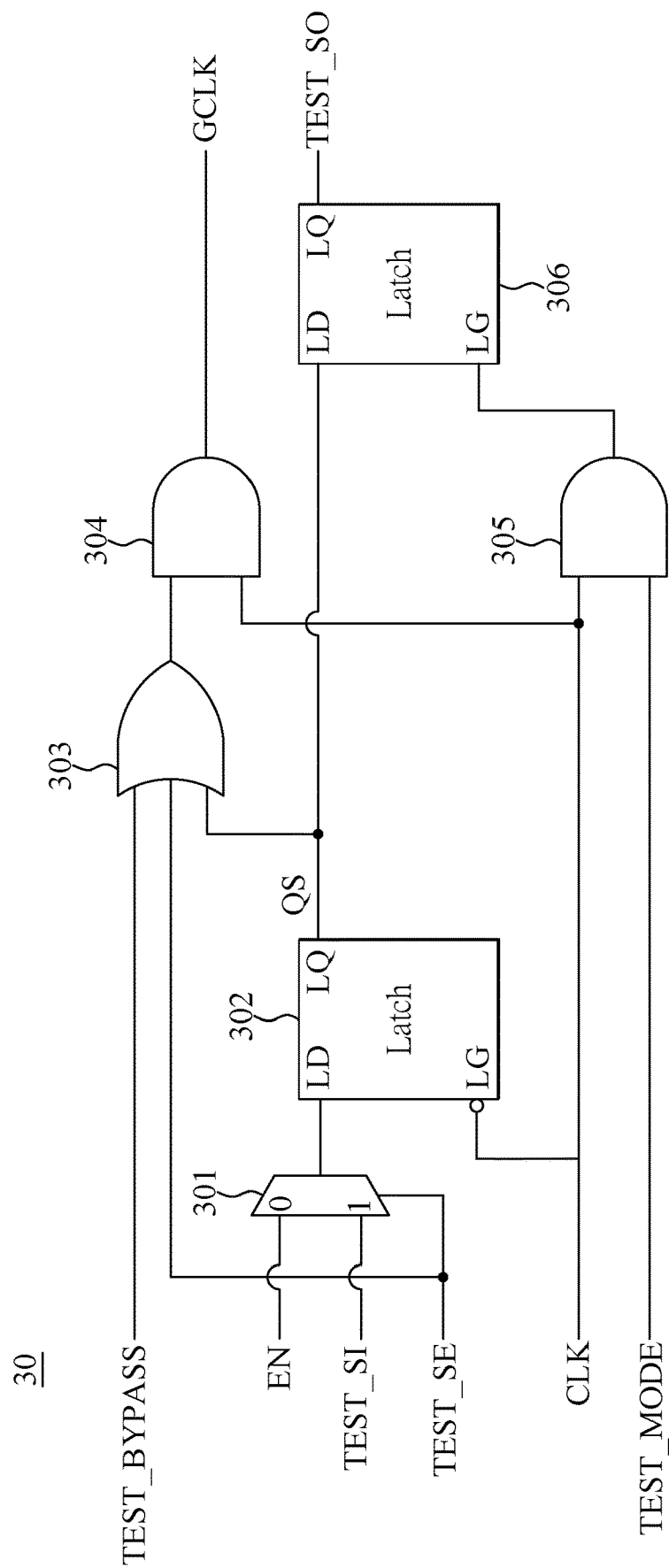
FIG. 3 is a schematic circuit diagram of a clock gating cell provided by an embodiment of the present disclosure.

Reference is made to FIG. 3, which is a schematic circuit diagram of a clock gating cell provided by an embodiment of the present disclosure. The clock gating cell 30 includes a selector 301, a first latch 302, an OR gate 303, a first AND gate 304, a second AND gate 305, and a second latch 306. The selector 301 has a first input terminal and a second input terminal respectively receiving a clock enable signal EN and a scan input signal TEST_SI, a selector terminal receiving a test enable signal TEST_SE, and an output terminal configured to output the clock enable signal EN or the scan input signal TEST_SI. In the present embodiment, the selector 301 can be preferably implemented as a 2-by-1 data multiplexer (MUX), but the present disclosure is not limited thereto. Therefore, when the selector terminal of the selector 301 receives the test enable signal TEST_SE at low level (0), the selector 301 selects the clock enable signal EN received by the first input terminal (0) as an output of the output terminal thereof. Conversely, when the selector terminal of the selector 301 receives the test enable signal TEST_SE at high level (1), the selector 301 selects the scan input signal TEST_SI received by the second input terminal (1) as the output of the output terminal thereof. In brief, the selector 301 selects the clock enable signal EN or the scan input signal TEST_SI as the output of the output terminal thereof according to the test enable signal TEST_SE.

The first latch 302 has a clock input terminal LG to receive a second clock signal (not shown in FIG. 3, but the second clock signal can be denoted as CLKB in the present embodiment) being an inversion of a first clock signal CLK, a data input terminal LD coupled to the output terminal of the selector 301, and a data output terminal LQ configured to output a latch signal QS. That is, when the clock input terminal LG of the first latch 302 receives the second clock signal CLKB at high level (1), that is, when the first clock signal CLK is at low level (0), the first latch 302 can directly output the clock enable signal EN or the scan input signal TEST_SI received by the data input terminal LD as the latch signal QS. In addition, when the clock input terminal LG of the first latch 302 receives the second clock signal CLKB at low level (0), that is, the first clock signal CLK is at high level (1), then the data output terminal LQ of the first latch 302 outputs the latch signal QS that maintains at the previous level. Since the operating principle of the latch is known to those skilled in the art, details of the first latch 302 will not be repeated hereinafter.

The OR gate 303 has a first input terminal, a second input terminal and a third input terminal respectively receiving a test bypass signal TEST_BYPASS, the test enable signal TEST_SE and the latch signal QS, and an output terminal configured to output operational results generated by performing logic OR operations respectively on the test bypass signal TEST_BYPASS, the enable signal TEST_SE and the latch signal QS. The first AND gate 304 has a first input terminal coupled to the output terminal of the OR gate 303, a second input terminal receiving the first clock signal CLK, and an output terminal configured to output a gating clock signal GCLK. Therefore, according to the teachings mentioned above, those skilled in the art should understand that, when the test enable signal TEST_SE is at low level (0), the clock gate control unit 30 can simply use the selector 301, the first latch 302, the OR gate 303, and the first AND gate 304 to perform a functional mode of clock gating. For example, reference is made to FIG. 4, which is a timing diagram of the clock gating cell 30 of FIG. 3 being used in the functional mode.

Figure 4:
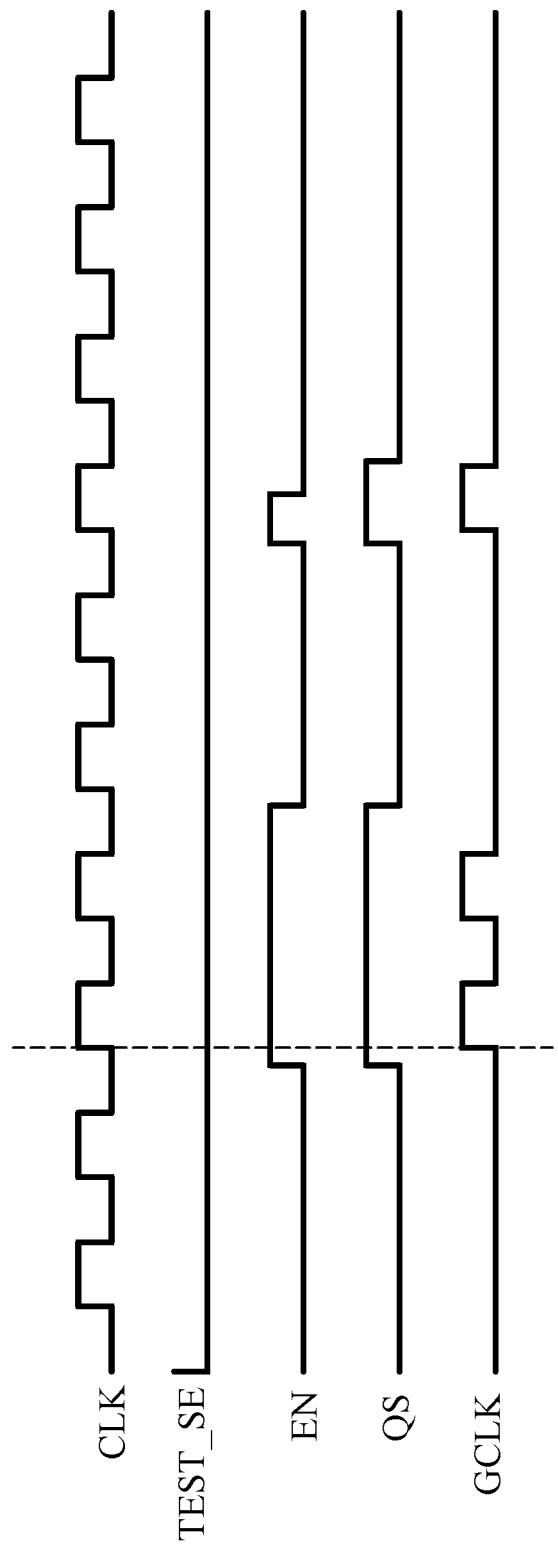
FIG. 4 is a timing diagram of the clock gating cell of FIG. 3 being used in a functional mode.

As shown in FIG. 4, in the functional mode, the test enable signal TEST_SE is fixed at low level (0), and the second clock signal CLKB received at the clock input terminal LG of the first latch 302 is at high level (1), that is, when the first clock signal CLK is at low level (0) and the data enable terminal LD of the first latch 302 receives the clock enable signal EN at high level (1), the first latch 302 can directly output the clock enable signal EN at high level (1) as the latch signal QS to the OR gate 303. At the same time, since the OR gate 303 receives at least one input signal at high level (1), the output terminal of the OR gate 303 outputs the operation result that is high level (1) to first AND gate 304, thereby making the first AND gate 304 can directly output the first clock signal CLK as the gating clock signal GCLK. In addition, when the clock enable signal EN is at low level (0), the clock gating cell 30 also stops outputting the gating clock signal GCLK. Since the operating principle of clock gating is known to those skilled in the art, details thereof will not be repeated hereinafter.

On the other hand, reference is made back to FIG. 3, the second AND gate 305 has a first input terminal and a second input terminal respectively receiving the first clock signal CLK and the test mode signal TEST_MODE, and an output terminal configured to output operational results generated by performing logic AND operations respectively on the first clock signal CLK and the test mode signal TEST_MODE. The second latch 306 has a clock input terminal LG coupled to the output terminal of the second AND gate 305, a data input terminal LD coupled to the data output terminal LQ of the first latch 302, and a data output terminal LQ configured to output a scan output signal TEST_SO. Similarly, when the clock input terminal LG of the second latch 306 receives an output of the second AND gate 305 at high level (1), that is, when the first clock signal CLK and the test mode signal TEST_MODE are both at high level (1), the second latch 306 can directly output the latch signal QS of the first latch 302 received by the data input terminal LD as the scan output signal TEST_SO. In addition, when the clock input terminal LG of the second latch 306 receives the output of the second AND gate 305 at low level (0), that is, when at least one of the first clock signal CLK and the test mode signal TEST_MODE is at low level (0), the data output terminal LQ of the second latch 306 outputs the scan output signal TEST_SO that maintains at the previous level.

Figure 2:
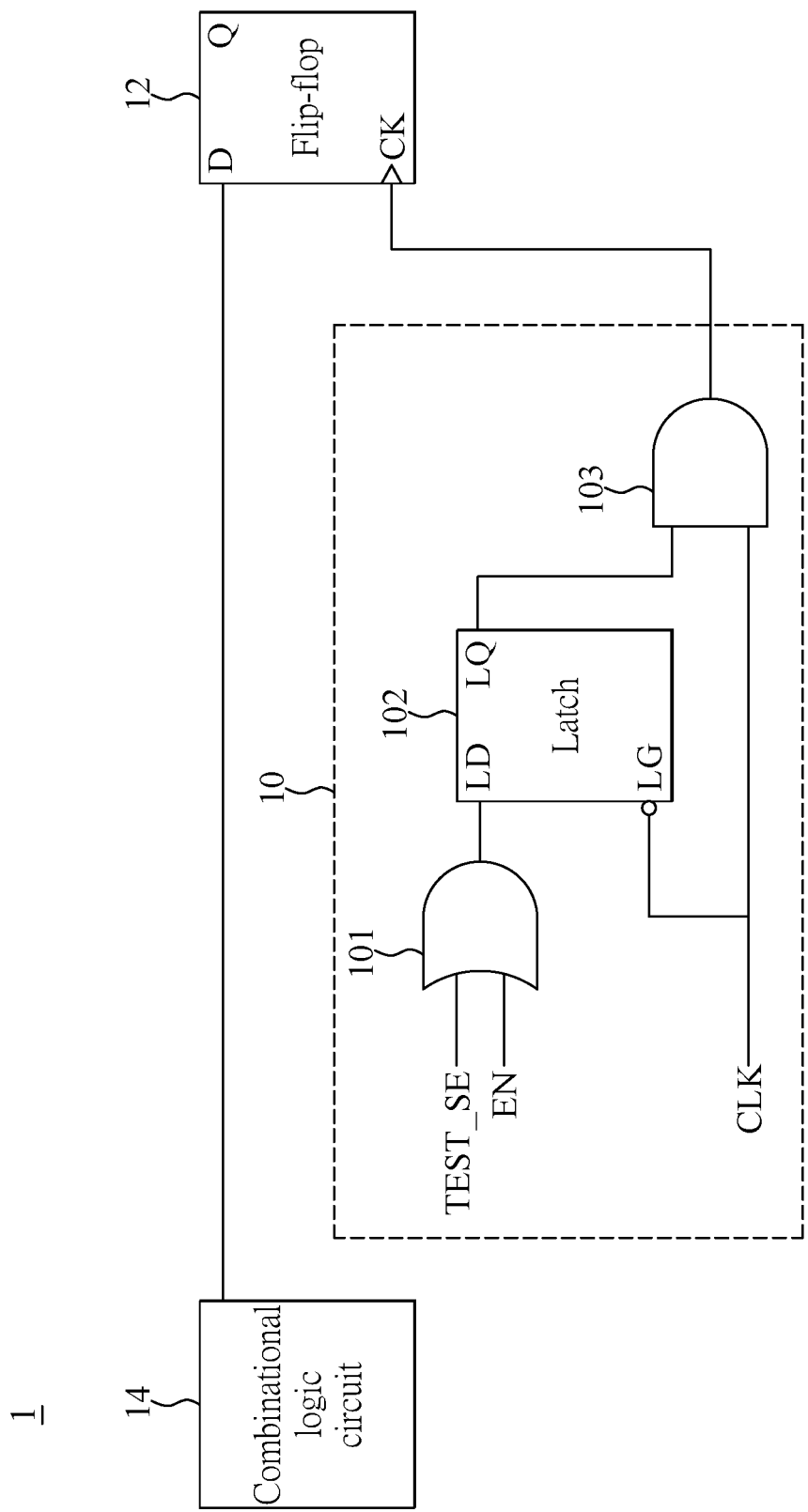
FIG. 2 is a schematic diagram showing that the clock gating cell of FIG. 1 is used in a scan chain.

That is, the first latch 302 and the second latch 306 can serve as a master latch and a slave latch, such that the first latch 302 and the second latch 306 constitute a flip-flop. Therefore, by utilizing such a circuit structure, the flip-flop can also use the positive/negative edges of the first clock signal CLK to store the values of the input terminal. In contrast, the selector 301 included in the clock gating cell 30 is provided for the flip-flop to store the values of different input terminals. In addition, since the scan output signal TEST_SO can be used to detect faults of the first latch 302, the flip-flop can be used as a scan flip-flop, or it should be noted that the clock gating cell 30 further includes functions of the scan flip-flop, so that the clock gating cell 30 can be directly connected to a scan chain 1 of FIG. 2. Since the operational principle of the flip-flop or the scan flip-flop is already known by those skilled in the art, the details thereof will not be repeated hereinafter.

In addition, when the test mode signal TEST_MODE is fixed at high level (1), the second AND gate 305 can directly output the first clock signal CLK to the clock input terminal LG of the second latch 306. However, since the scan output signal TEST_SO is not needed in a non-scan testing mode (for example, the functional mode of clock gating), the test mode signal TEST_MODE can be fixed at low level (0) at this time, thereby making the second AND gate 305 stop outputting the first clock signal CLK to the second latch 306, or it can be referred to as forcefully turning off a storage unit that is not used (i.e., the second latch 306), so as to achieve the effect of power saving. In brief, unlike the test bypass signal TEST_BYPASS, an independent signal is additionally designed for the present embodiment (i.e., test mode signal TEST_MODE) to control whether the second AND gate 305 outputs the first clock signal CLK. In this way, the test bypass signal TEST_BYPASS can be directly controlled in a scan testing mode in the present embodiment, for example, the test bypass signal TEST_BYPASS can be directly connected to a control terminal of a testing apparatus. However, the details of the test bypass signal TEST_BYPASS will be described in other paragraphs hereinafter and the repeated descriptions are omitted here.

Figure 5A:
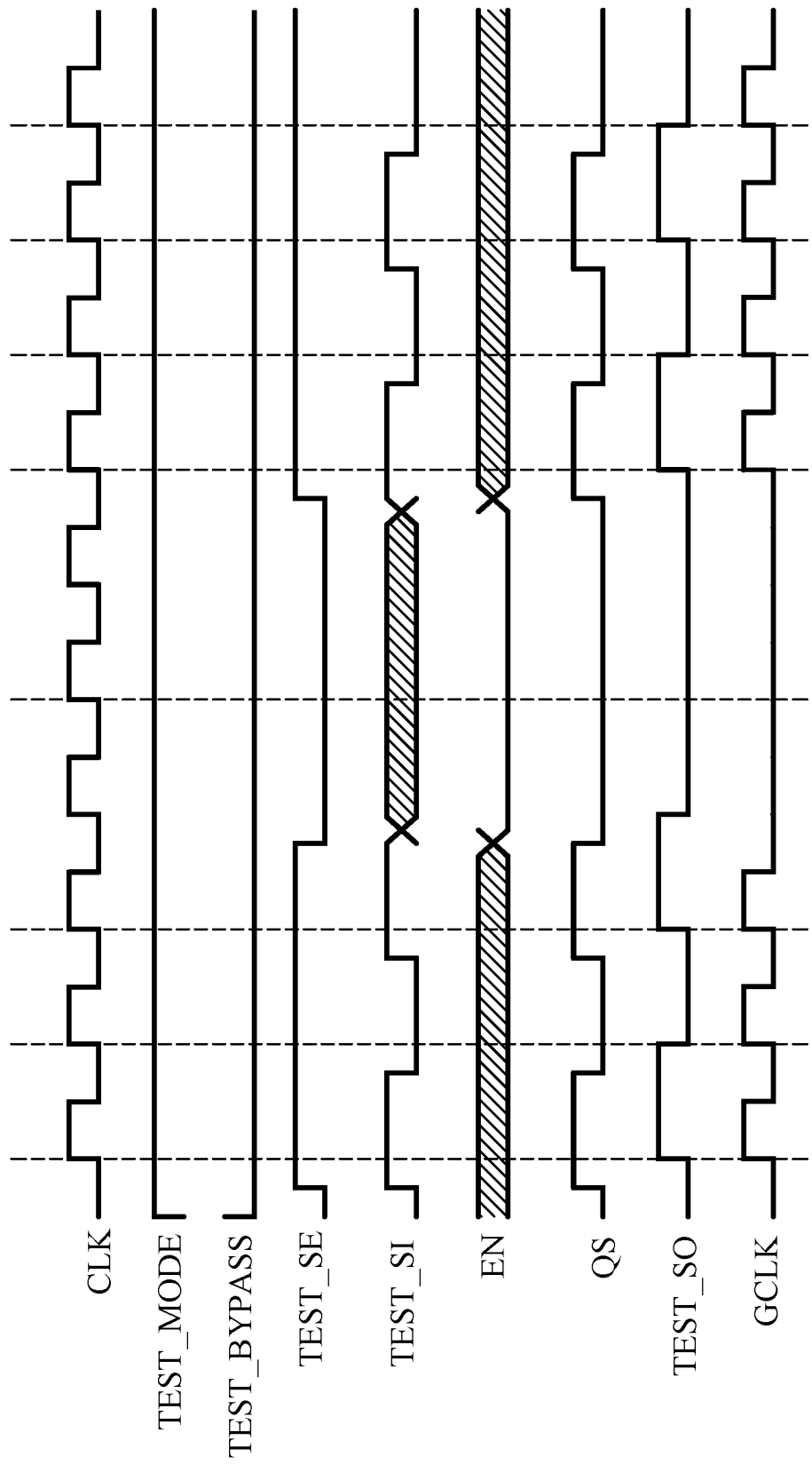
FIG. 5A is a timing diagram showing the clock gating cell of FIG. 3 being used in a scan testing mode while a test bypass signal is fixed at low level.
Figure 5B:
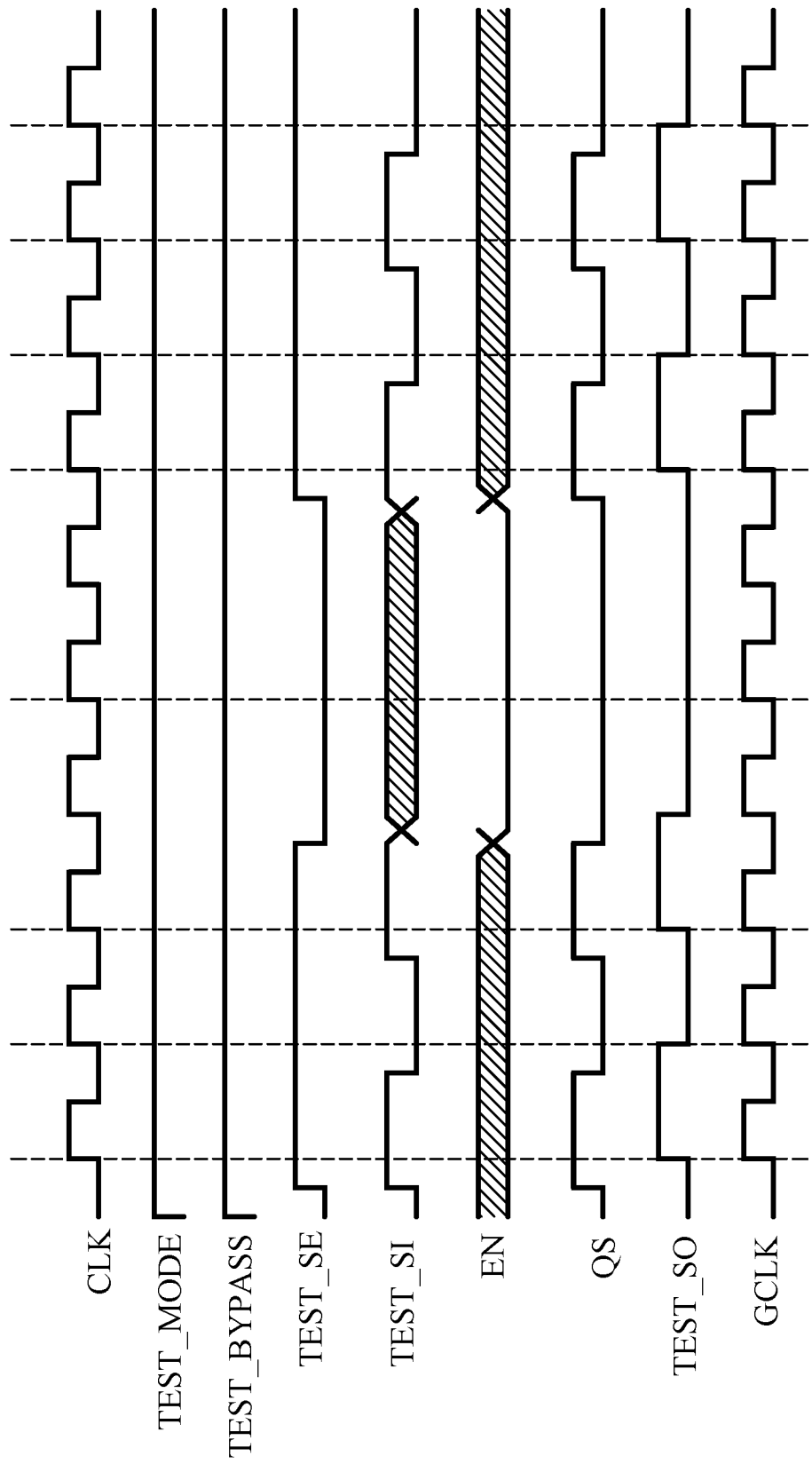
FIG. 5B is a timing diagram showing the clock gating cell of FIG. 3 being used in a scan testing mode while a test bypass signal is fixed at high level.

Next, in order to further explain an operational flow of the clock gating cell 30 in the scan testing mode, reference is made to FIGS. 5A and 5B. FIG. 5A is a timing diagram showing the clock gating cell 30 of FIG. 3 being used in the scan testing mode while the test bypass signal TEST_BYPASS is fixed at low level (0), and FIG. 5B is a timing diagram showing the clock gating cell 30 of FIG. 3 being used in the scan testing mode while the test bypass signal TEST_BYPASS is fixed at high level (1).

As shown in FIG. 5A, in the scan testing mode, the test mode signal TEST_MODE is fixed at high level (1), such that the second AND gate 305 directly outputs the first clock signal CLK to the clock input terminal LG of the second latch 306. In addition, the scan testing mode can be divided into a scan shift duration and a scan capture duration. In the scan shift duration, the test enable signal TEST_SE is fixed at high level (1), and when the selector terminal of the selector 301 receives the test enable signal TEST_SE at high level (1), the selector 301 selects the scan input signal TEST_SI as the output of the output terminal thereof, and the clock gating cell 30 is not affected by the clock enable signal EN at this moment. Therefore, a waveform of the clock enable signal EN at this moment can be represented by a slant-lined frame area, and when the first clock signal CLK is at low level (0), the first latch 302 directly output the scan input signal TEST_SI as the latch signal QS, and when the first clock signal CLK is at high level (1), the first latch 302 outputs the latch signal QS that maintains at the previous level.

Simultaneously, when the first clock signal CLK is at high level (1), the second latch 306 directly outputs the latch signal QS as the scan output signal TEST_SO, and when the first clock signal CLK is at low level (0), the second latch 306 outputs the scan output signal TEST_SO that maintains at the previous level. However, since the OR gate 303 receives at least one input signal at high level (1) at this time (i.e., the test enable signal TEST_SE), the first AND gate 304 directly outputs the first clock signal CLK as the gating clock signal GCLK.

Next, in the scan capture duration, the test enable signal TEST_SE is fixed at low level (0), and when the selector terminal of the selector 301 receives the test enable signal TEST_SE at low level (0), the selector 301 changes to select the clock enable signal EN as the output of the output terminal thereof, and the clock gating cell 30 is not affected by the scan input signal TEST_SI at this moment. Therefore, a waveform of the scan input signal TEST_SI at this moment can be represented by a slanted frame area, and when the first clock signal CLK is at low level (0), the first latch 302 directly outputs the clock enable signal EN as the latch signal QS, and when the first clock signal CLK is at high level (1), the first latch 302 outputs the latch signal QS that maintains at the previous level.

Simultaneously, when the first clock signal CLK is at high level (1), the second latch 306 directly outputs the latch signal QS as the scan output signal TEST_SO, and when the first clock signal CLK is at low level (0), the second latch 306 outputs the scan output signal TEST_SO that maintains at the previous level. However, since the OR gate 303 does not receive any input signal at high level (1) at this time, the first AND gate 304 stops outputting the gating clock signal GCLK. Since the subsequent details are as described above, the repeated descriptions are omitted hereinafter. In brief, in the scan shift duration, the test enable signal TEST_SE can be fixed at high level (1), such that the first AND gate 304 directly outputs the first clock signal CLK as the gating clock signal GCLK.

On the other hand, compared to the scan capture duration of FIG. 5A, in the scan capture duration of FIG. 5B, since the test bypass signal TEST_BYPASS is fixed at high level (1), the OR gate 303 receives at least one input signal at high level (1), thereby making the first AND gate 304 directly output the first clock signal CLK as the gating clock signal GCLK. That is, unlike the conventional clock gating cell, two independent signals (i.e., the test enable signal TEST_SE and the test bypass signal TEST_BYPASS) can be designed to provide for the present embodiment to forcefully turn on the first AND gate 304 to output the first clock signal CLK as the gating clock signal GCLK in each of the scan shift duration and the scan capture duration.

In other words, unlike the test mode signal TEST_MODE, an independent signal is additionally designed for the present embodiment (i.e., test bypass signal TEST_BYPASS) to forcefully turn on the first AND gate 304 to output the first clock signal CLK in the scan capture duration. As mentioned above, in this way, the test bypass signal TEST_BYPASS can be directly controlled in the scan testing mode in the present embodiment, for example, the test bypass signal TEST_BYPASS can be directly connected to the control terminal of the testing apparatus. Therefore, when the test bypass signal TEST_BYPASS is controlled to be at high level (1), the clock gating cell 30 can force the first clock signal CLK to be output as the gating clock signal GCLK to ensure the flip-flops on the scan chain are connected to the first AND gate 304, and the scan chain can perform the scan test normally due to receiving the clock signal.

On the contrary, if there is no test bypass signal TEST_BYPASS, the clock gating cell 30 must use scan samples to input control values to the first latch 302 through the scan input signal TEST_SI, so as to force the first clock signal CLK to be output as the gating clock signal GCLK. However, this manner is equivalent to adding additional scan samples of the output gating clock signal GCLK, which results in an increase in the number of the scan samples. In addition, not only is the test bypass signal TEST_BYPASS utilized, but the present embodiment also utilizes another independent signal (i.e. the test enable signal TEST_SE) to force the first AND gate 304 to output the first clock signal CLK in the scan shift duration, and ensure that the clock signal will not be stopped during the scan shift duration, so as to prevent scan samples from not being input normally when no clock signal is provided in the scan shift duration. Since details of other intervals of FIG. 5B have already been described above, the repeated descriptions are omitted hereinafter.

In conclusion, the embodiment of the present disclosure provides a clock gating cell suitable for a scan chain, the clock gating cell includes two latches that can be configured as a flip-flop to use positive/negative edges of a first clock signal to store a value of an input terminal, and the clock gating cell also includes a selector that can selectively have the flip-flop store values of different input terminals. In addition, in a non-scan testing mode, the clock gating cell can forcefully close an unused latch through an independent signal to achieve an effect of power saving, and in a scan shift duration and a scan capture duration of a scan testing mode, the clock gating cell further forcefully outputs the first clock signal as the gating clock signal according to two independent signals.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A clock gating cell, comprising:
a selector having a first input terminal and a second input terminal respectively receiving a clock enable signal and a scan input signal, a selector terminal receiving a test enable signal, and an output terminal configured to output the clock enable signal or the scan input signal, wherein the selector is configured to select the clock enable signal or the scan input signal as an output of the output terminal according to the scan enable signal;
a first latch having a clock input terminal receiving a second clock signal being an inversion of a first clock signal, a data input terminal coupled to the output terminal of the selector, and a data output terminal configured to output a latch signal;
an OR gate having a first input terminal, a second input terminal and a third input terminal respectively receiving a test bypass signal, the test enable signal and the latch signal, and an output terminal configured to output operational results generated by performing logic OR operations respectively on the test bypass signal, the test enable signal and the latch signal; and
a first AND gate having a first input terminal coupled to the output terminal of the OR gate, a second input terminal receiving the first clock signal, and an output terminal configured to output a gating clock signal.

2. The clock gating cell according to claim 1, further comprising:
a second AND gate having a first input terminal and a second input terminal respectively receiving the first clock signal and a test mode signal, and an output terminal configured to output operational results generated by performing logic AND operations respectively on the first clock signal and the test mode signal.

3. The clock gating cell according to claim 2, further comprising:
a second latch having a clock input coupled to the output terminal of the second AND gate, a data input terminal coupled to the data output terminal of the first latch, and a data output terminal configured to output a scan output signal.

4. The clock gating cell according to claim 3, wherein the first latch and the second latch serve as a master latch and a slave latch, such that the first latch and the second latch constitute a flip-flop.

5. The clock gating cell according to claim 4, wherein the flip-flop serves as a scan flip-flop, such that the clock gating cell can be directly connected to a scan chain.

6. The clock gating cell according to claim 5, wherein in a scan testing mode, the test mode signal is fixed at high level, such that the second AND gate directly outputs the first clock signal to the clock input terminal of the second latch, and in a non-scan testing mode, the test mode signal is fixed at low level, such that the second AND gate stops outputting the first clock signal to the clock input terminal of the second latch.

7. The clock gating cell according to claim 6, wherein in a scan shift duration of the scan testing mode, the test enable signal is fixed at high level, such that the first AND gate directly outputs the first clock signal as the gating clock signal, and in a scan capture duration of the scan testing mode, the test bypass signal is fixed at high level, such that the first AND gate directly outputs the first clock signal as the gating clock signal.

* * * * *